(12) United States Patent
Jerome et al.

(10) Patent No.: US 8,691,670 B2
(45) Date of Patent: Apr. 8, 2014

(54) METHODS OF FORMING A SEMICONDUCTOR DEVICE

(71) Applicant: Intersil Americas Inc., Milpitas, CA (US)

(72) Inventors: Rick Carlton Jerome, Washougal, WA (US); Francois Hebert, San Mateo, CA (US); Craig McLachlan, Melbourne Beach, FL (US); Kevin Hoopingarner, Palm Bay, FL (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/717,899

(22) Filed: Dec. 18, 2012

(65) Prior Publication Data

US 2013/0157416 A1 Jun. 20, 2013

Related U.S. Application Data

(60) Division of application No. 12/887,797, filed on Sep. 22, 2010, now Pat. No. 8,476,150, which is a continuation-in-part of application No. 12/719,988, filed on Mar. 9, 2010.

(60) Provisional application No. 61/299,702, filed on Jan. 29, 2010.

(51) Int. Cl.
*H01L 21/20* (2006.01)
*H01L 21/36* (2006.01)

(52) U.S. Cl.
USPC ........... 438/479; 438/455; 438/458; 257/507; 257/E21.09

(58) Field of Classification Search
USPC ............ 438/455, 458, 479; 257/507, E21.09, 257/E29.003
See application file for complete search history.

(56) References Cited

U.S. PATENT DOCUMENTS

| 5,387,555 | A | 2/1995 | Linn et al. |
| 5,552,345 | A * | 9/1996 | Schrantz et al. .............. 438/460 |
| 6,964,880 | B2 | 11/2005 | Ravi |
| 2004/0180512 | A1 | 9/2004 | Linn et al. |
| 2004/0256624 | A1* | 12/2004 | Sung ............................. 257/77 |
| 2005/0019967 | A1* | 1/2005 | Ravi ............................... 438/26 |
| 2007/0284660 | A1 | 12/2007 | Deguet et al. |
| 2011/0186840 | A1 | 8/2011 | Jerome et al. |

OTHER PUBLICATIONS

U.S. Patent and Trademark Office, "Office Action", "U.S. Appl. No. 12/719,988", Feb. 23, 2012, pp. 1-8.
U.S. Patent and Trademark Office, "Office Action", "U.S. Appl. No. 12/719,988", Sep. 27, 2012, pp. 1-7.
U.S. Patent and Trademark Office, "Notice of Allowance", "U.S. Appl. No. 12/887,797", Nov. 27, 2012, pp. 1-7.
U.S. Patent and Trademark Office, "Office Action", "U.S. Appl. No. 12/887,797", Jul. 31, 2012, pp. 1-11.
U.S. Patent and Trademark Office, "Restriction Requirement", "U.S. Appl. No. 12/887,797", Apr. 13, 2012, pp. 1-9.

* cited by examiner

*Primary Examiner* — Phuc Dang
(74) *Attorney, Agent, or Firm* — TraskBritt

(57) ABSTRACT

A method and structure for a semiconductor device, the device including a handle wafer, a diamond layer formed directly on a front side of the handle wafer, and a thick oxide layer formed directly on a back side of the handle wafer, the oxide layer of a thickness to counteract tensile stresses of the diamond layer. Nitride layers are formed on outer surfaces of the diamond layer and thick oxide layer and a polysilicon is formed on outer surfaces of the nitride layers. A device wafer is bonded to the handle wafer to form the semiconductor device.

12 Claims, 9 Drawing Sheets

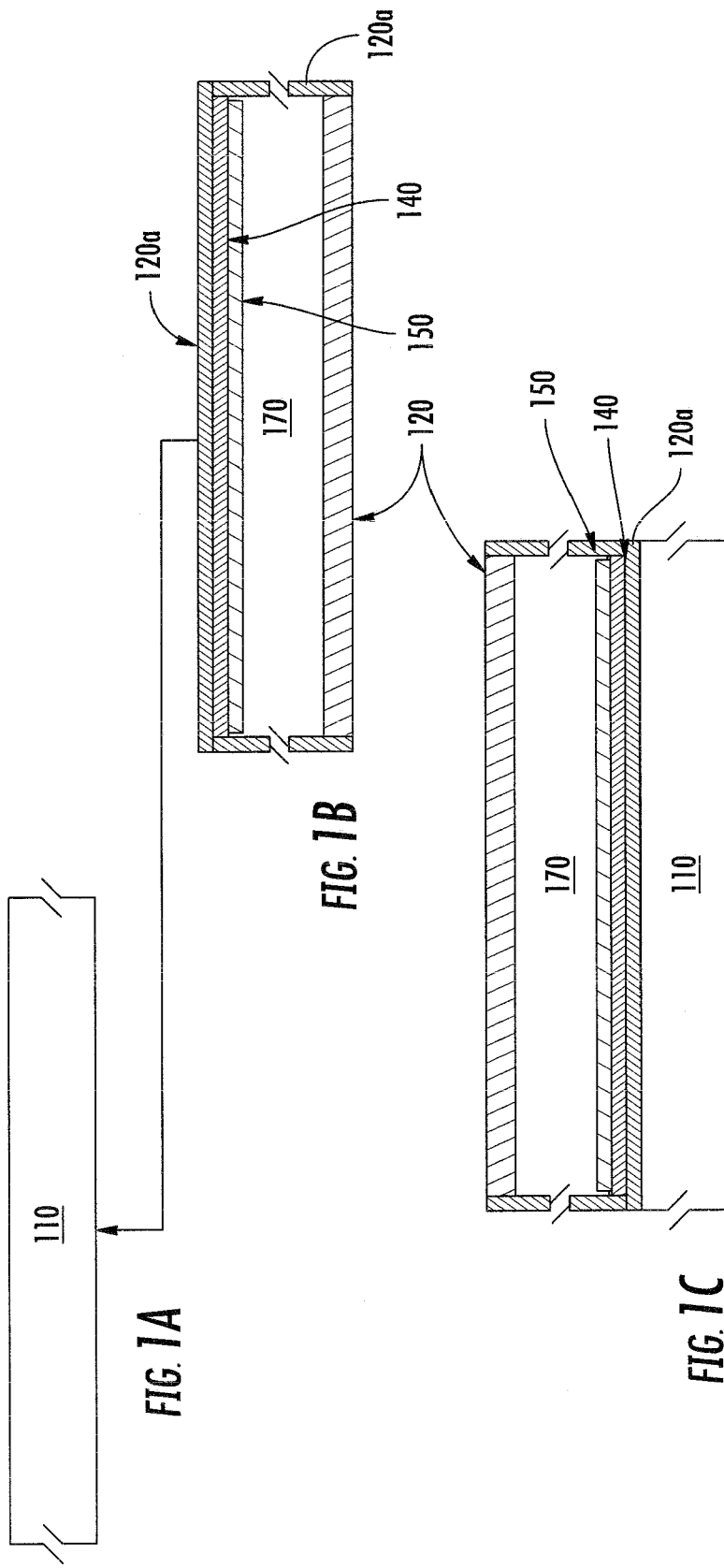

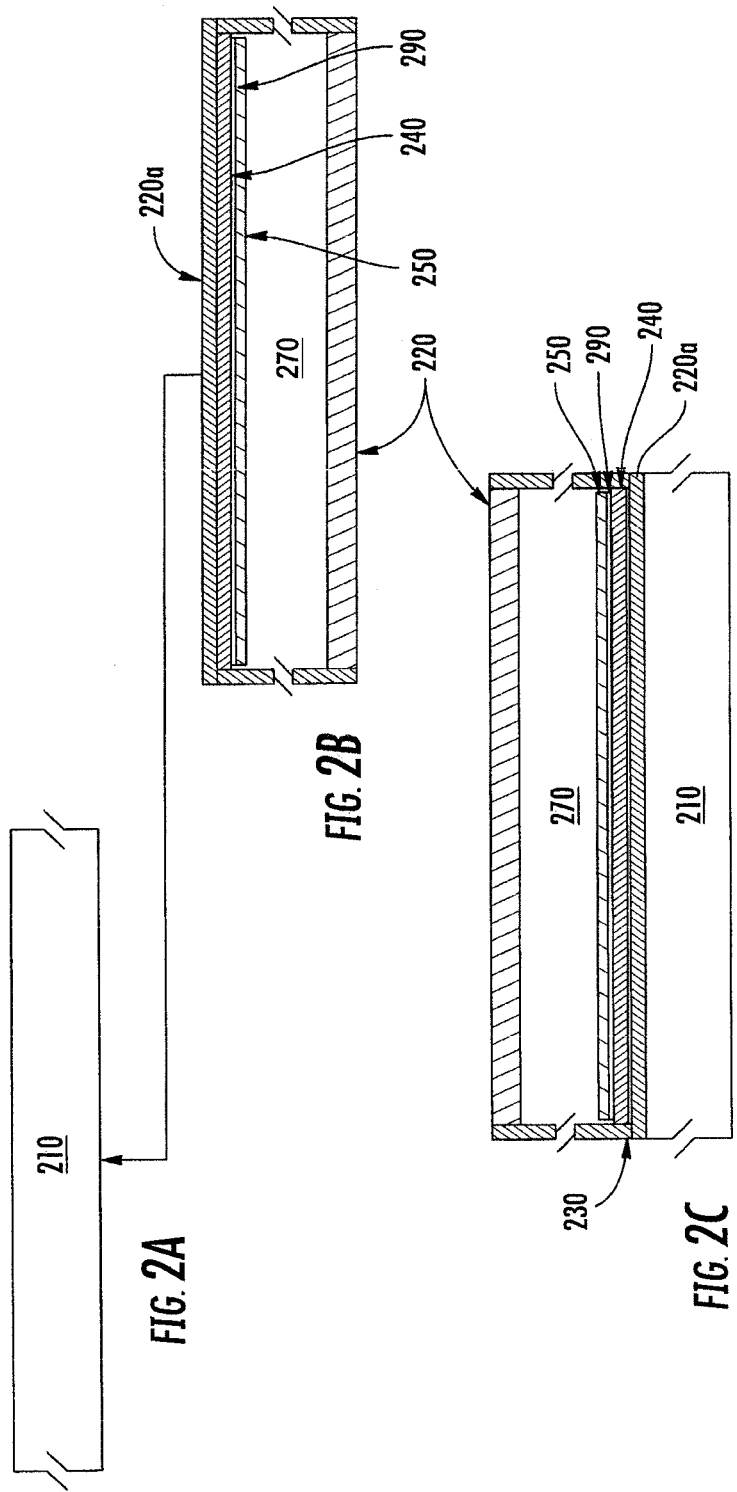

METHODS OF FORMING A SEMICONDUCTOR DEVICE

CROSS-REFERENCE TO RELATED APPLICATIONS

This application is a divisonal of U.S. patent application Ser. No. 12/887,797, filed on Sep. 22, 2010, now U.S. Pat. No. 8,476,150, issued Jul. 2, 2013, which is a continuation-in-part of U.S. patent application Ser. No. 12/719,988, filed on Mar. 9, 2010, which claims priority to U.S. Provisional Application No. 61/299,702, filed on Jan. 29, 2010, all of which are incorporated by reference herein in their entirety.

BACKGROUND

Diamond SOI (SODOS, silicon-on-diamond-on-silicon), Diamond-on-Silicon, and Thin Silicon-on-Thick Diamond process technologies are being developed to enhance heat flow through a substrate for use in high power devices. In the case of SODOS, the buried diamond layer is used as a heat sink, a heat spreader that reduces the temperature of semiconductor devices operating at high power in the device silicon. Thermal conductivity of diamond is ten times better than silicon and one thousand times better than oxide.

Despite high-purity components used in an HFCVD reactor (Hot Filament Chemical Vapor Deposition), elevated levels of mobile heavy metal ions have been found to out-diffuse from the diamond and seed layer into the adjacent device silicon layer, thus degrading the quality of the silicon and reducing electron and hole current carrier lifetime. During subsequent diffusion operations, these ions can out-diffuse from the diamond and silicon layers and cross-contaminate fabrication processing equipment.

An improved diamond SOI device and method of forming the same would be desirable, in which a barrier can be formed between the diamond SOI layer and the device silicon layer to block diffusion of ions and improve carrier lifetime of the device silicon.

A further modification of the barrier above can be desirable, in which the barrier is a nitride and a back side nitride etch is used followed by a growing a thick oxide on the back side of the device wafer, prior to bonding the device wafer to a handle wafer.

An improved diamond SOI device and method of forming the same would be desirable, in which diamond and nitride layers can be formed on a handle wafer rather than a device wafer, to maintain integrity of the device wafer.

BRIEF DESCRIPTION OF THE SEVERAL VIEWS OF THE DRAWINGS

The accompanying drawings, which are incorporated in and constitute a part of this specification, illustrate embodiments of the invention and together with the description, serve to explain the principles of the invention. In the figures:

FIGS. 1A through 1E depict a diamond SOI device and corresponding method of forming, in accordance with embodiments of the present teachings;

FIGS. 2A through 2E depict a further exemplary diamond SOI device and corresponding method for forming, in accordance with embodiments of the present teachings;

Figure 1D:
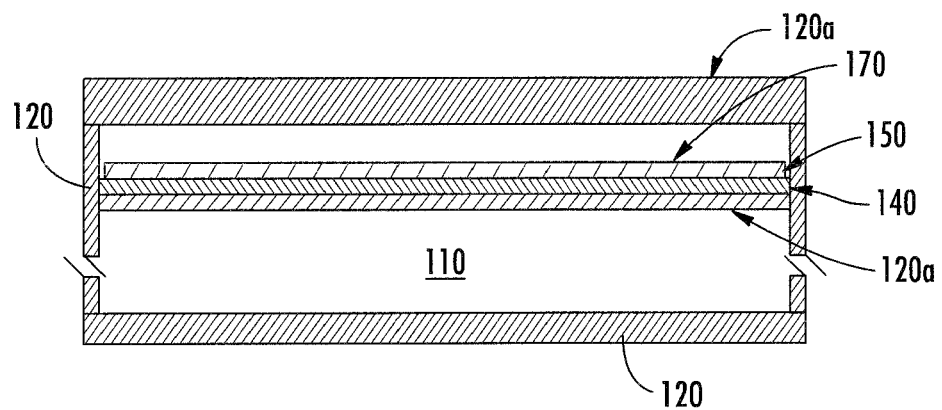

It should be noted that some details of the figures have been simplified and are drawn to facilitate understanding of the inventive embodiments rather than to maintain strict structural accuracy, detail, and scale.

DETAILED DESCRIPTION

Reference will now be made in detail to the present embodiments (exemplary embodiments) of the invention, examples of which are illustrated in the accompanying drawings. Wherever possible, same reference numbers will be used throughout the drawings to refer to the same or like parts. In the following description, reference is made to the accompanying drawings that form a part thereof, and in which is shown by way of illustration, specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Embodiments of the present teachings can provide a method for and device in which a thin nitride barrier (silicon nitride or other nitride) placed between the diamond SOI layer and the device silicon layer blocks the diffusion of ions into the device layer and improves lifetime of the device silicon. In accordance with the above-described embodiments, a diamond seed layer and corresponding grown diamond layer have high levels of metallic and mobile ion contaminates. The thin nitride layer between the diamond layer and device silicon will block the diffusion of contaminates into the device silicon layer above the diamond layer as well as a handle or substrate below the diamond layer, and improves carrier lifetime of the device silicon.

The thin nitride layer has minimal effect on the thermal conductivity of the diamond-SOI layer. In certain embodiments, a polysilicon layer on top of the thin nitride layer promotes seeding density when a moat clean (moat clean is a B-clean, described below, with a longer HCL rinse) is used to remove contaminate ions from the diamond seed layer. Moreover, the thin nitride layer considerably simplifies a subsequent trench isolation process.

With the use of a thin nitride layer between the diamond layer and device silicon, oxidation of the diamond layer can be blocked, and further provide a good etch stop for silicon trench etch, a subsequent operation that may be used to laterally isolate devices on the surface of the wafer.

Embodiments of the present teachings can provide a method for and device in which the above nitride barrier is utilized, and additionally a back side nitride etch is provided and a thick oxide layer is grown on the back side of the device wafer, prior to bonding of the device wafer to a handle wafer.

Embodiments of the present teachings can further provide a method for and device in which diamond and barrier layer processing occurs on the handle wafer in order to maintain a more pristine device wafer. In this embodiment, diamond layers can be formed on the silicon of the handle wafer and a nitride layer can be formed over the diamond layer.

FIGS. 1A through 1E depict a diamond silicon-on-insulator (SOI) device (e.g., 100 in FIG. 1E) and corresponding method of forming, in accordance with embodiments of the present teachings. It should be readily apparent to one of ordinary skill in the art that the device 100 and method depicted in FIGS. 1A through 1E represents a generalized schematic illustration and that other steps and components can be added or existing steps and components can be removed or modified.

Figure 1E:
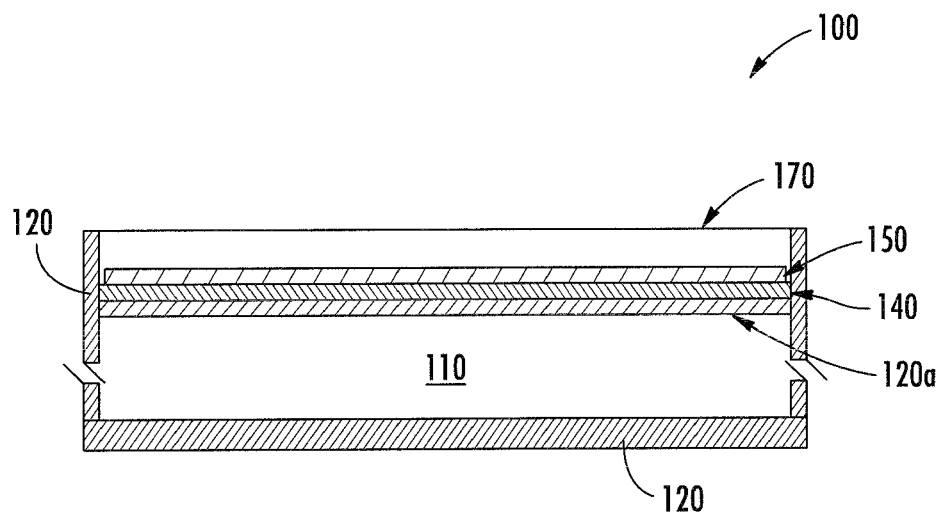

In FIG. 1E, the device structure 100 can include a handle wafer 110, a planarized polysilicon 120 on the handle wafer 110, a diamond layer 140 on the planarized polysilicon 120, a thin nitride layer 150 on the diamond layer 140, and a device 170 formed on the thin nitride layer 150. In FIG. 1E, polysilicon encapsulant 120a has been planarized and removed from the device 170 side as shown.

In FIG. 1A, the handle wafer 110 is depicted, which is suitable for the exemplary embodiments. The handle wafer 110 can include an oxide material. The handle wafer 110 can include an oxide material or layers of oxide material, on part or all of its surfaces. The handle wafer 110 can be formed in a process including, for example, steps of spin/rinse/dry (SRD), BW Backtouch, potassium hydroxide (KOH) clean, Scribe, Post Backtouch clean (where HF strips oxide from a handle wafer, sulfuric, standard clean 1, standard clean 2), and bond clean.

An exemplary device wafer 170 is depicted in FIG. 1B. The device wafer 170 can include a thin nitride layer 150 on a surface of the device wafer 170, a diamond layer 140 on a surface of the thin nitride layer 150, and a polysilicon coating 120 on the diamond layer 140 and on a surface of the device wafer 170 opposing the diamond layer 140.

The device wafer 170 can include a substrate, wafer or epitaxial layer, silicon or other semiconductor layer. In general, the semiconductor layer can be any material which can withstand diamond growth conditions (temperature greater than 700° C., for example). For example, the semiconductor can include at least one of silicon, SiGe, SiC, GaN, InP, GaAs, AlGaN, InAlN, AlGaN, or combinations thereof. It will be appreciated that the handle wafer 110 or device wafer 170 can be either N- or P-type, with low or high doping concentration, depending on the application.

The device wafer 170 can be formed in a process in which the wafer is typically pre-cleaned in SC1/SC2 solutions, for example, and in which silicon nitride is deposited via a LPCVD (low pressure chemical vapor deposition) process to a thickness of about 1000 Å. Subsequent to formation of the device wafer 170, a diamond seed layer can be chemically deposited by immersion in a colloid solution containing nanoparticles of diamond dust (not shown), from which the diamond layer 140 can be grown to about 1.5 µm. Subsequent to configuring the diamond layer 140, the polysilicon 120 can be deposited to about 2 µm over at least the device 170 side and the diamond 140 side. In addition, the polysilicon 120 can encapsulate the structure as shown in FIG. 1B. The polysilicon 120 deposited over the diamond layer 140 can be planarized (120a) by a chemical mechanical polishing (CMP) process, after which a bond clean can be performed.

The thin nitride layer 150 can be deposited or otherwise formed to a thickness having suitable ion blocking effectiveness. The thin nitride layer 150 can be one of $Si_3N_4$, $Si_xN$, AlN, TaN, TiN, and silicon oxy-nitride. Certain metallic barriers can include TiW and TiWN as potential "metallic" barriers. As depicted in FIG. 1C, the CMP planarized polysilicon 120a can be bonded to the handle wafer 110, as also known in the art. Subsequent to bonding the device wafer 170 structure with the handle wafer 110, the bonded wafer structure can be inverted for additional processing as will be further shown and described.

In FIG. 1D, the polysilicon 120 is on the device 170 side, and the device wafer 170 itself, can be treated to reduce its thickness to within about 15 µm of the diamond-silicon interface. The treatment can include grinding as known in art, followed by a KOH clean, a post polish clean, and B-clean. B-Clean consists of $H_2SO_4/H_2O_2$ (to remove organics), 10:1 HF diluted with DI $H_2O$, SC1 ($NH_4OH/H_2O_2$ to remove particles), and SC2 ($HCL/H_2O_2$ to remove metallics). Further, a polysilicon layer 120 can again be formed on the reduced thickness device wafer 170 silicon. For example, the polysilicon can be formed to a thickness of about 2 µm. It will be appreciated that polysilicon is simultaneously deposited on the front and the backside of the wafer. This backside polysilicon is used for stress control in order to reduce warpage of the wafer.

As depicted in FIG. 1E, the device 170 side can be polished to remove the polysilicon layer 120, resulting in a device silicon thickness of about 3 to about 7 µm. In order to render this device silicon thickness, polishing can remove about 7 to about 10 µm of polysilicon 120 and device 170 silicon.

In FIGS. 1D and 1E, the thin nitride layer 150 can include a silicon nitride at a thickness of about 0.1 µm, and the diamond layer 140 can be at a thickness of about 1.5 µm. In certain embodiments, hydrogen implantation (SMART-CUT®) can be used to separate wafers after bonding. Here, the implant is done before the wafers are bonded. After bonding, a thermal step splits the wafer at the peak of the implant. This hydrogen implantation can be used in the formation of thin Silicon-on-Diamond-on-Silicon layers, in addition to grinding and polishing. For this approach, thinner device silicon in the range of about 0.1 to about 1.5 microns is generally possible, depending on the hydrogen implant energy.

FIGS. 2A through 2E depict a diamond silicon-on-insulator (SOI) device (e.g., 200 in FIG. 2E) and corresponding method of forming, in accordance with additional embodiments of the present teachings. It should be readily apparent to one of ordinary skill in the art that the device 200 and method depicted in FIGS. 2A through 2E represents a generalized schematic illustration and that other steps and components can be added or existing steps and components can be removed or modified.

Figure 2D:
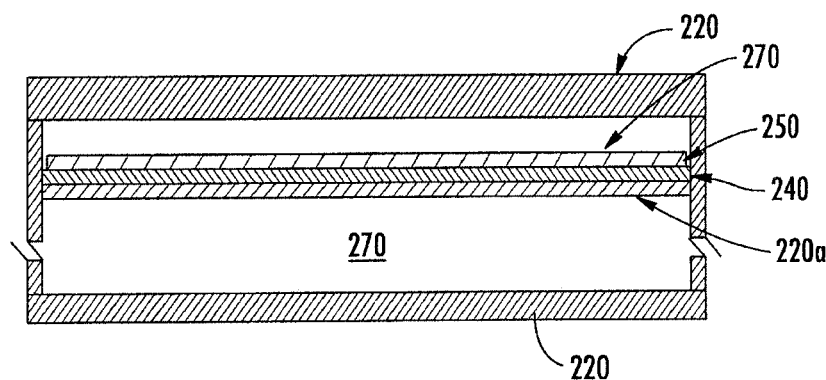
Figure 2E:
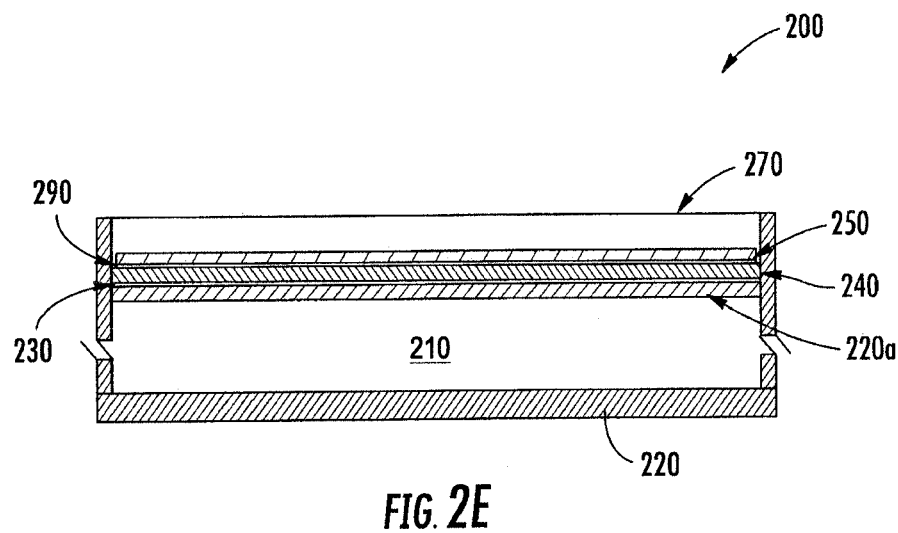

In FIG. 2E, the device structure 200 can include a handle wafer 210, a planarized polysilicon 220 on the handle wafer 210, a nitride barrier 230 on the planarized polysilicon 220, a diamond layer 240 on nitride layer 230, a thin polysilicon layer 260 (of about 300 Å used to promote seeding) on diamond layer, a thin nitride layer 250 on polysilicon layer 260, a thin pad oxide layer 290 (of about 650 Å) on nitride layer 250, and device 270 on pad oxide layer 290. The polysilicon encapsulant 220 can be planarized and removed from the device 270 side as shown.

In FIG. 2A, the handle wafer 210 is depicted, which is suitable for the exemplary embodiments. The handle wafer 210 can include an oxide material. The handle wafer 210 can be formed in a process including, for example, steps of spin/rinse/dry (SRD), BW Backtouch, KOH Clean, Scribe, Post Backtouch clean, and bond clean.

An exemplary device wafer 270 is depicted in FIG. 2B. The device wafer 270 can include a thin oxide layer 290 on a surface of the device wafer 270, a thin nitride layer 250 on a surface of the oxide layer 290, (a thin (about 300 Å) polysilicon layer 260 can be inserted here to promote seeding), a diamond layer 240 on a surface of the thin nitride layer 250, and a polysilicon coating 220 on both of the diamond layer 240 and the opposing surface of the device wafer 270. In addition, a thin layer of polysilicon (about 300 Å) can be deposited on top of the nitride to promote seeding. In the FIG. 2B, layer 250 includes thin oxide layer 290 between thin nitride layer 250 and device 270. In certain embodiments, an additional nitride layer 230 can be formed on the diamond layer 240. The additional nitride layer 230 can be a nitride barrier on top of diamond layer 240 (i.e., between the diamond layer 240 and the planarized polysilicon 220a) to totally encapsulate diamond film layer 240.

The device wafer 270 can include a substrate, wafer or epitaxial layer, silicon or other semiconductor layer. In general, the semiconductor layer can be any material that can withstand diamond growth conditions (temperature greater than 700.degree. C., for example). For example, the semiconductor can include at least one of silicon, SiGe, SiC, GaN, InP, GaAs, AlGaN, InAlN, AlGaN, or combinations thereof.

The device wafer 270 can be formed in a process in which the wafer is typically pre-cleaned in SC1/SC2 solutions, for example, a pad oxide is grown to a thickness of about 300 Å (it has been determined by the inventors that 625 Å of pad oxide can be needed as an etchstop at a trench etch), and a low pressure chemical vapor deposition (LPCVD) silicon nitride is deposited to a thickness of about 1000 Å. In certain embodiments the pad oxide thickness can be in the range of about 100 Å to about 1000 Å. A pad oxide at the thinner end of the range can minimize thermal resistance, but a pad oxide at a thicker end of the range can be also be utilized depending on the process architecture and flow. A diamond seed layer (not shown) can be deposited, from which the diamond layer 240 can be grown to a thickness of about 1.5 µm. In certain embodiments, the diamond layer 240 can be in the range of about 0.1 µm to about 100 micron. Increased thermal conductivity can be obtained at the higher end of the exemplary range. Subsequent to configuring the diamond layer 240, the polysilicon 220 can be deposited to a thickness of about 2 µm over at least the device 270 side and the diamond 240 side. In addition, the polysilicon 220 can encapsulate the structure as shown in FIG. 2D. The polysilicon 220 deposited over the diamond layer 240 can be planarized (220a) by a CMP process, after which a bond clean can be performed. In certain embodiments, the polysilicon 220 can be undoped, unless it is desirable to have a doped layer to form a "low resistance buried layer," which can be beneficial for some approaches like NPN bipolar flows.

The thin nitride layer 250 and nitride layer 230 can be deposited or otherwise formed to a thickness having suitable ion blocking effectiveness. In certain embodiments, the additional nitride barrier 230 can be formed at the interface of the diamond layer 240 and the polysilicon 220. With the additional nitride barrier layer 230, the diamond layer 240 can be entirely encapsulated.

The thin nitride layer 250 and the additional nitride barrier layer 230 can be deposited or otherwise formed to a thickness having suitable ion blocking effectiveness. The nitride barrier layer 230 can have a thickness of from about 500 Å to about 3000 Å. Further, the nitride barrier layer 230 can have a thickness of about 1000 Å. The thin nitride layer 250 and nitride barrier layer 230 can be one of $Si_3N_4$, $Si_xN$, AlN, TaN, and TiN.

As depicted in FIG. 2C, the CMP planarized polysilicon 220a can be bonded to the handle wafer 210, as known in the art. Subsequent to bonding the structure of FIG. 2B with the handle wafer 210, the bonded wafer structure is inverted for further processing as will be further shown and described.

In FIG. 2D, the polysilicon 220 on the device 270 side and the device wafer 270 itself can be treated to reduce its thickness to within about 15 µm of the diamond-silicon interface. The treatment can include grinding as known in art, followed by a KOH clean, a post polish clean, and B-clean. Further, a polysilicon layer 220 can be formed on the reduced thickness device wafer 270. For example, the polysilicon 220 can be formed or otherwise configured to a thickness of about 2 µm.

As depicted in FIG. 2E, the device 270 side can be polished to remove the polysilicon layer 220, resulting in a device silicon thickness of about 3 to about 7 µm. In order to render this device silicon thickness, polishing can remove about 7 to about 10 µm of polysilicon and device silicon structure.

In FIGS. 2D and 2E, the thin nitride 250 can include a silicon nitride at a thickness of about 0.1 µm, and the diamond layer 240 can be at a thickness of about 1.5 µm.

In the embodiment described, it will be appreciated that the polysilicon layer on top of nitride can be provided to promote seeding. The polysilicon has better thermal conductivity than dielectrics, and this allows maximization of the thickness of the nitride barrier itself (because oxidizing the nitride to improve nucleation reduces the barrier properties and increases the thermal resistance). Polysilicon also has similar nucleation properties as silicon (better than moat cleaned nitride). Depositing polysilicon on one side only can reduce the diamond deposition on the side which is not polysilicon coated, if, for example, the underlying layer is nitride. The polysilicon can further act as a "gettering" layer (can trap impurities in grain boundaries). In addition, moat etch can be used to leach out metallic contaminates from the seed layer if polysilicon is used on top of the nitride layer. Even further, the described thin nitride layer between the diamond seed layer and device silicon will block the oxidation of the diamond layer and provide a good etch stop for trench etch. A pad oxide thickness of about 650 Å on top of the nitride provides a better etch stop and ensures the entire thickness of nitride is preserved after trench etch. This can solve the problem in which integration of trench isolation is problematic due to flammability of the diamond layer when exposed to normal thermal oxidation conditions. The described embodiments further solve process issues for diamond SOI integration at minimal expense to heat flow because the nitride and pad oxide layers are thin. Thermal conductivity for LPCVD stoichiometric silicon nitride=25-36 W/m-K. By comparison, silicon dioxide=1.3, room temperature silicon=148, and diamond=1300 W/m-K.

In each of the embodiments described, in-situ deposition of nitride and/or polysilicon can be performed in a diamond reactor (not shown), to eliminate exposure of subsequent nitride and/or polysilicon deposition systems to cross-contamination.

FIGS. 3A through 3F depict a diamond silicon-on-insulator (SOI) device (e.g., 300 in FIG. 3F) and corresponding method of forming, in accordance with additional embodiments of the present teachings. It should be readily apparent to one of ordinary skill in the art that the device 300 and method depicted in FIGS. 3A through 3F represents a generalized schematic illustration and that other steps and components can be added or existing steps and components can be removed or modified.

Figure 3A:
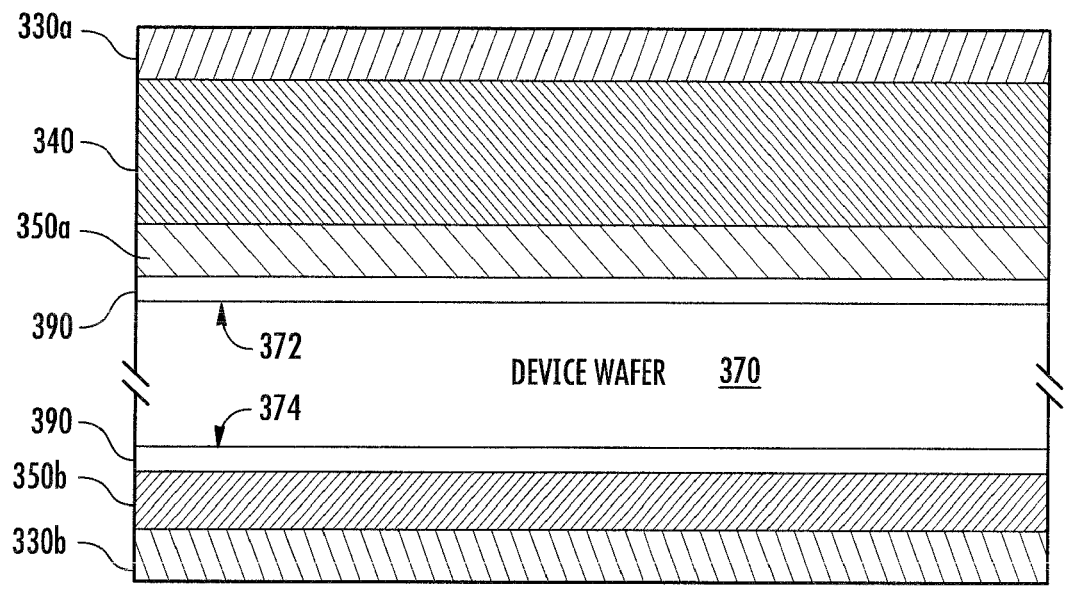
FIGS. 3A through 3F depict a further exemplary diamond SOI device and corresponding method for forming, in accordance with embodiments of the present teachings.
Figure 3B:
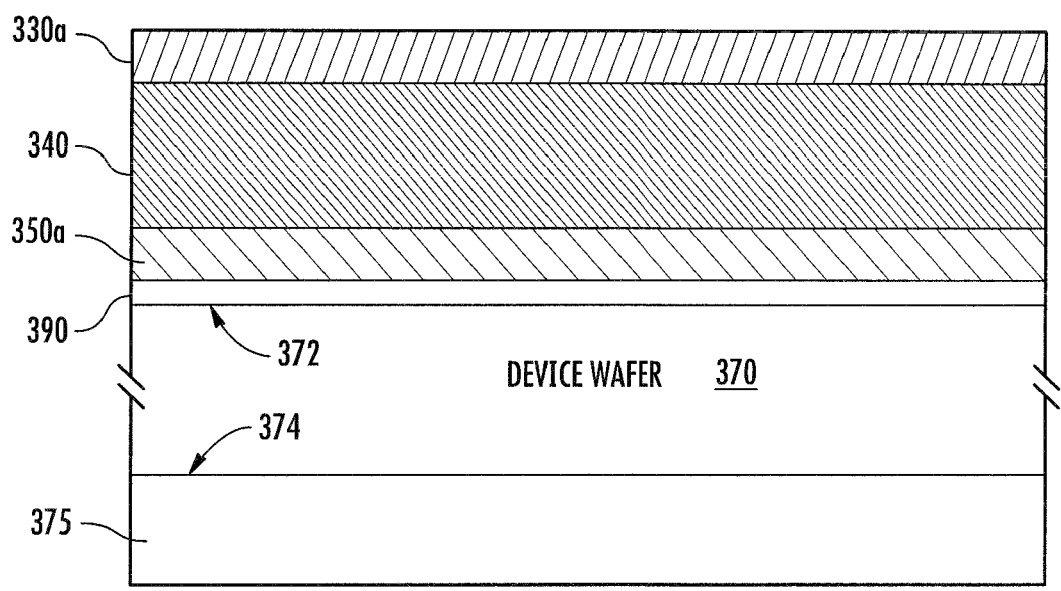
Figure 3C:
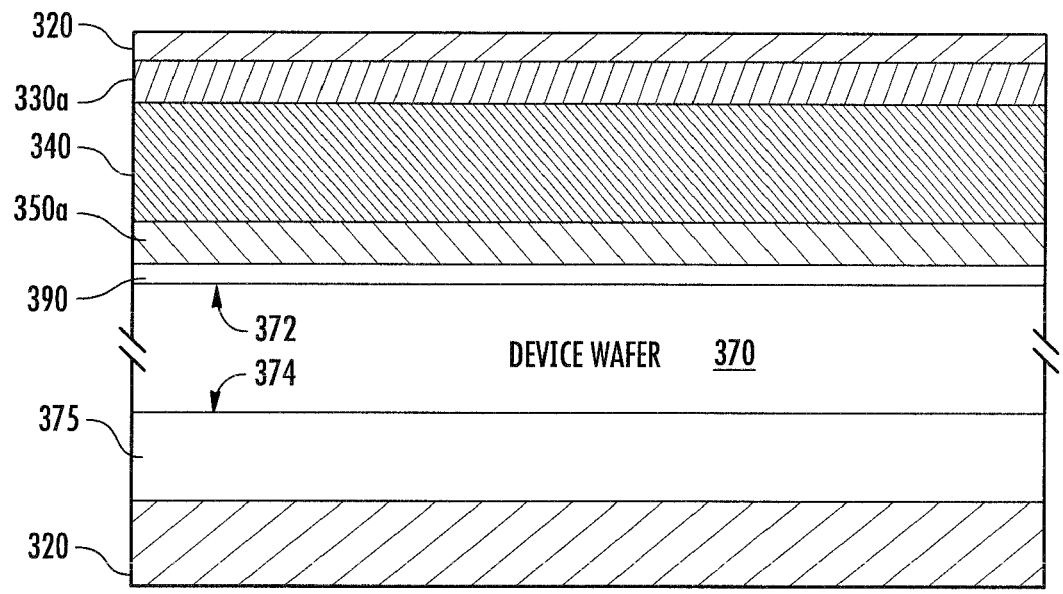
Figure 3D:
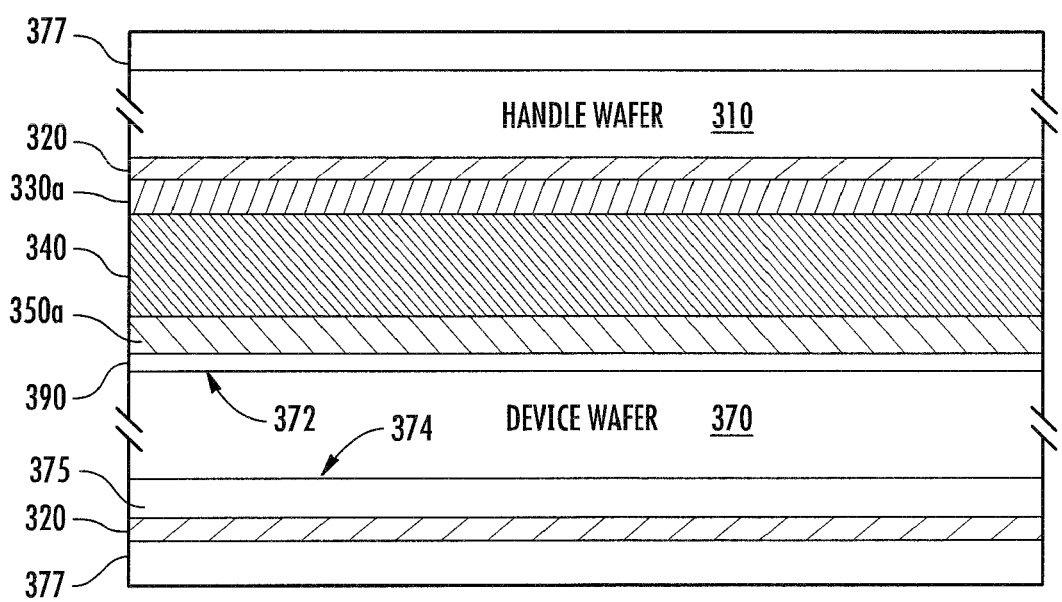
Figure 3E:
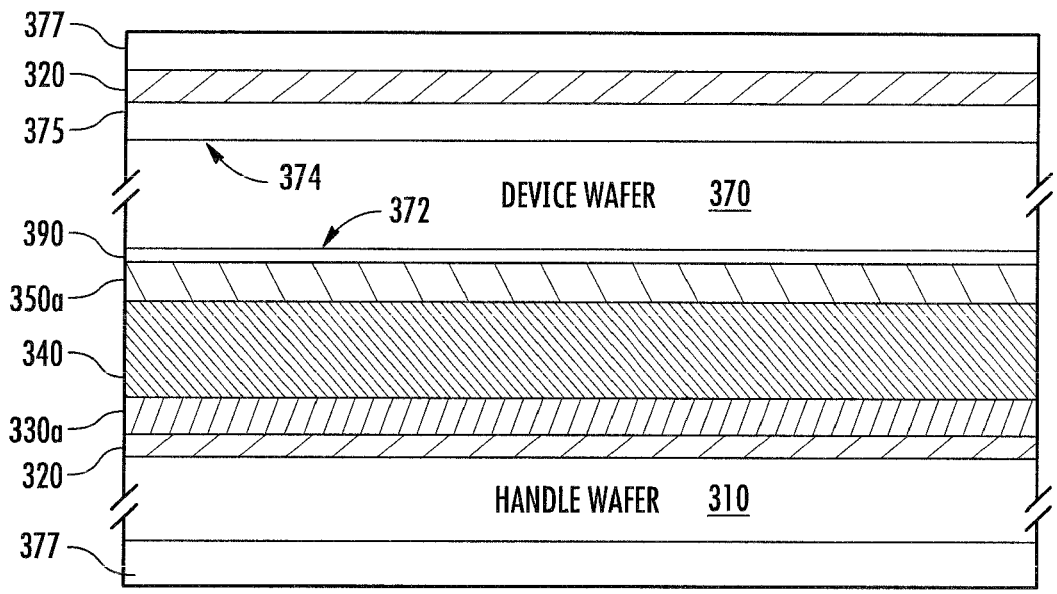
Figure 3F:
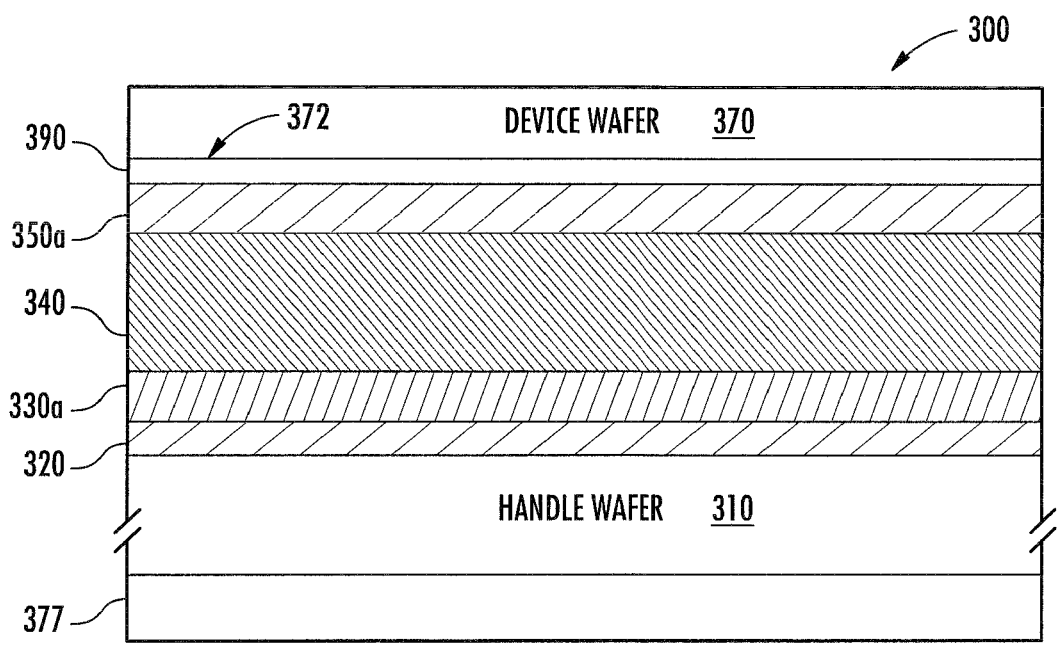

In FIG. 3F, the device structure 300 can include a handle wafer 310 and a device wafer 370. The combined structure 300 can include a planarized polysilicon 320 on the handle wafer 310, a nitride barrier layer 330a on the planarized polysilicon 320, a diamond layer 340 on the nitride layer 330a, a nitride layer 350a on an opposite side of the diamond layer 340, a thin pad oxide layer 390 (of about 650 Å) on the nitride layer 350a and a device wafer 370 on the pad oxide layer 390.

The handle wafer 310 can be formed in a process including, for example, steps of spin/rinse/dry (SRD), BW Backtouch, KOH Clean, Scribe, Post Backtouch Clean, and Bond Clean.

In FIG. 3A, an exemplary device wafer 370 is depicted alone, in a configuration prior to bonding to the handle wafer 310. The device wafer 370 can include a front side 372 and a back side 374. It will be appreciated that the relative indication of a front side and back side is for purposes of explanation only, and could be reversed. The pad oxide layers 390 can be grown on both the front side 372 and back side 374 of the device wafer 370, thin nitride layers 350a, 350b formed on the pad oxide layers 390, the diamond layer 340 formed on nitride layer 350a, and a further nitride layer 330a, 330b deposited to encapsulate the diamond layer 340 and correspondingly add a further thickness to the first nitride layer 350b deposition. The device wafer 370 can include a substrate, wafer or epitaxial layer, silicon or other semiconductor layer. In general, the semiconductor layer can be any material which can withstand diamond growth conditions (temperature greater than about 700.degree. C., for example). For example, the semiconductor can include at least one of silicon SiGe, SiC, GaN, InP, GaAs, AlGaN, InAlN, AlGaN, or combinations thereof.

The device wafer 370 can formed in a process in which the device wafer 370 is typically pre-cleaned in SC1/SC2 solution, the pad oxide layer 390 is grown to a thickness of about 650 Å, depositing a first nitride layer 350 to a thickness of about 1200 Å by a low pressure chemical vapor deposition (LPCVD), depositing a diamond seed layer on the first nitride layer 350, growing the diamond layer 340 from the seed layer to a thickness of about 1.5 μm, and encapsulating the formed structure with a further (second) nitride layer 330, deposited in a LPCVD to a thickness of about 1200 Å. In certain embodiments, the diamond layer 340 can be in the range of about 0.1 micron to about 100 micron. Increased thermal conductivity can be obtained at the higher end of the exemplary range.

The thin nitride layers 350, 330 can be deposited or otherwise formed to a thickness having suitable ion blocking effectiveness. Each of the nitride layers 350, 330, can have a thickness of from about 500 Å to about 3000 Å. Further, the nitride layers 350, 330, can have a thickness of about 1200 Å. The nitride layers 350, 330 can be one of $Si_3N_4$, $Si_xN$, AlN, TaN, and TiN.

By way of reference, and for purposes of description, it will be appreciated that the diamond layer 340 can be considered to be formed on a front side 372 of the device wafer 370 and a side of the device wafer 370 absent the diamond layer 340 can be referred to as a back side 374 of the device wafer 370.

As shown in FIG. 3B, the device wafer 370 can be etched from the back side 374 thereof. Etching can be by a dry etch, and can etch through all of the second nitride layer 330a, first nitride layer 350a, and pad oxide 390 on the back side 374 of the device wafer 370. Next, a thermal oxide 375 can be grown on the back side 374 of the device wafer 370 as shown. The thermal oxide 375 can be grown or otherwise configured, to a thickness of about 2 μm.

Referring now to FIG. 3C, polysilicon 320 can be deposited to a thickness of about 2 μm over both the front side 372 and back side 374 of the device wafer 370. The polysilicon 320 can be planarized on the front side of the device wafer 370. The planarization can be done by CMP, and can include a touch polish to render the polysilicon 320 to a thickness of about 5,000 Å to about 10,000 Å on the front side 372 of the device wafer 370. A bond clean can be performed subsequent to the planarization. In certain embodiments, the polysilicon 320 can be undoped, unless it is desirable to have a doped layer to form a "low resistance buried layer," which may be beneficial for some approaches like NPN bipolar flows.

As depicted in FIG. 3D, the planarized polysilicon 320 can be bonded to the handle wafer 310 as known in the art. Bonding of the handle wafer 310 to the device wafer 370 generates growth of an oxide 377 on exposed outer surfaces of the device structure 300.

FIG. 3E depicts the device structure of FIG. 3D in a flipped configuration. As depicted in FIG. 3F, the flipped device structure 300 can be further processed to grind the oxide 377/poly 320/oxide 375 to within about 15 μm of the device wafer 370-oxide 390 interface. A KOH clean is then performed, followed by each of a post polish clean and B-clean. The device wafer 370 is then polished again to within about 3 μm to about 7 μm of the device wafer 370-oxide 390 interface. The resulting device 300 is depicted in FIG. 3F with the structure as described above.

In certain embodiments, a handle wafer can be used for the device wafer. This approach can eliminate possible cross-contamination to other fabrication equipment. Such an exemplary configuration is depicted in FIGS. 4A through 4F.

Figure 4A:
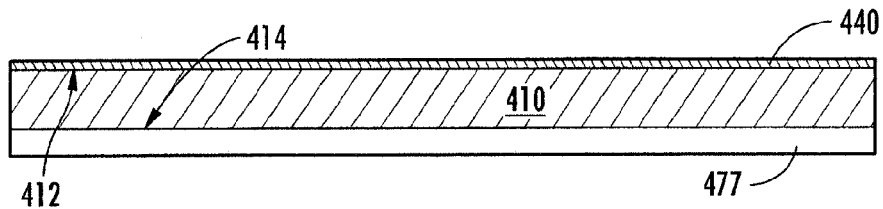
FIGS. 4A through 4F depict a further exemplary semiconductor device and corresponding method for forming, in accordance with embodiments of the present teachings.
Figure 4B:
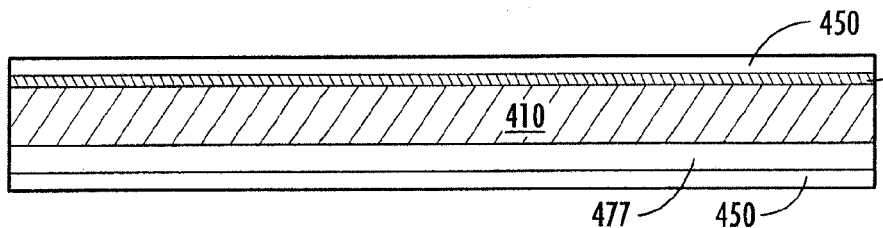
Figure 4C:
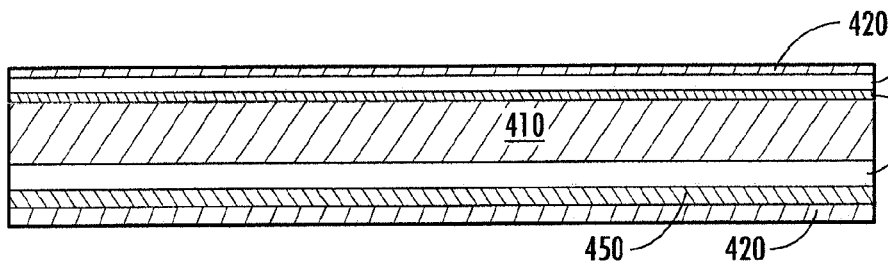
Figure 4D:
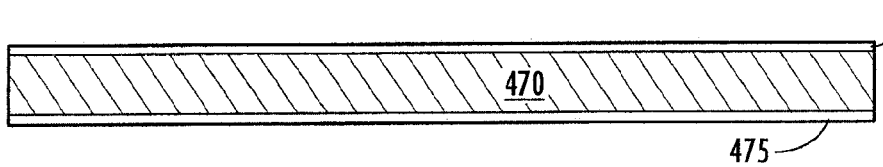
Figure 4E:
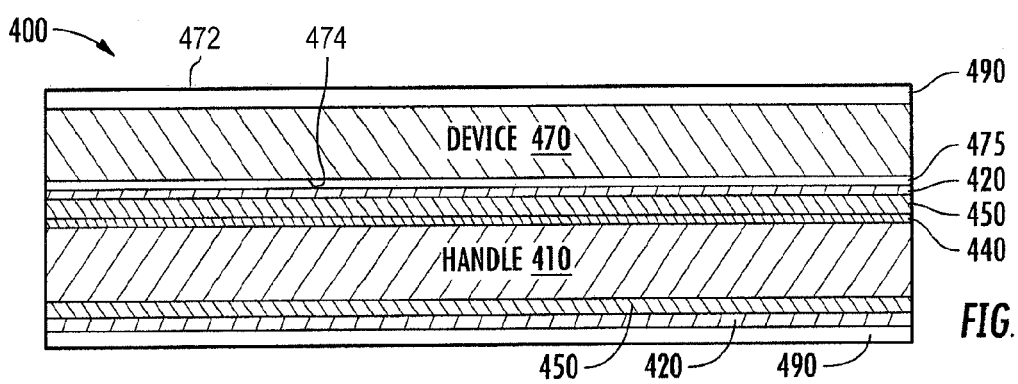
Figure 4F:
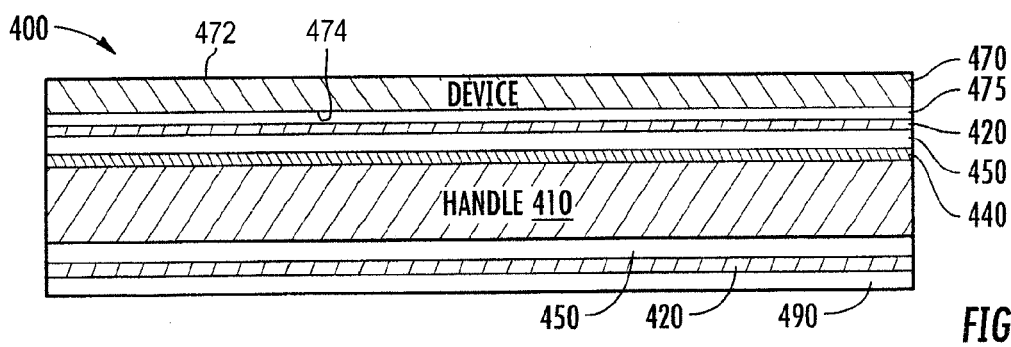

FIGS. 4A through 4C depict certain stages of processing a handle wafer 410, FIG. 4D depicts a device wafer 470, and FIGS. 4E and 4F depict bonding and processing of the handle wafer 410 and device wafer 470, each in accordance with exemplary embodiments herein. It should be readily apparent to one of ordinary skill in the art that the device and method depicted in FIGS. 4A through 4F represents a generalized schematic illustration and that other steps and components can be added or existing steps and components can be removed or modified.

The handle wafer 410 can include an oxide material and have a front side 412 and a back side 414. It will be appreciated that the terms front side and back side are used for purposes of discussion and that the terms could be reversed relative to the figures. The handle wafer 410 can include an oxide material or layers, on part or all of its surfaces. The handle wafer 410 can be formed in a process including, for example, steps of spin/rinse/dry (SRD), BW Backtouch, potassium hydroxide (KOH) clean, Scribe, Post Backtouch clean, and bond clean.

The device wafer 470 can include a substrate, wafer or epitaxial layer, silicon or other semiconductor layer. The device wafer 470 can have a front side 472 and a back side 474. It will be appreciated that the terms front side and back side are used for purposes of discussion and that the terms can be reversed relative to the figures. In general, the semiconductor can include at least one of silicon SiGe, SiC, GaN, InP, GaAs, AlGaN, InAlN, AlGaN, or combinations thereof. It will be appreciated that the handle wafer 410 or device wafer 470 can be either N- or P-type, with low or high doping concentration, depending upon the application.

As depicted in FIG. 4A, an oxide layer 477 can be formed on exposed planar surfaces of the handle wafer 410, however, in FIG. 4A, the oxide formed on the front side 412 has been removed by etching or a similar process known in the art. Deposition of the oxide layer 477 can be from about 1.5 to about 2.5 μm thick. As also depicted in FIG. 4A, a diamond layer 440 is formed on the front side 412 surface of the handle wafer 410.

Removal of the oxide from the front side 412 of the handle wafer 410 can render a "bowed" configuration of the handle wafer 410 in which the handle wafer 410 can become concave in the direction of the remaining oxide layer 477 on the back side 414 of the handle wafer 410. The concavity can be as much as a 130 micron bow in the handle wafer 410 in the presence of the handle wafer 410 and oxide layer 477. As will be further explained, the concavity will be compensated by the deposition of the diamond layer 440 on the front side 412 of the handle wafer 410 such that the net result is a slightly convex wafer of about 10 to about 40 microns bow in the handle wafer 410. Accordingly, a thickness of the oxide 477 on the surfaces (e.g., the back side 414) of the handle wafer 410 can be determined according to a thickness and internal stress of the diamond layer 440 to be deposited on the front side 412 of the handle wafer 410. By balancing the stresses of the diamond layer 440 against the stresses of the oxide layer 477 on the back side 414 of the handle wafer 410, a substantially flat or mildly convex handle wafer 410 can result, which is suitable for further processing.

Diamond layer deposition can include a diamond seed layer deposition on the handle wafer 410, growing the diamond layer 440 from the seed layer to a thickness of at least about 1.5 µm. In certain embodiments, the diamond layer 440 can be in the range of about 0.1 micron to about 100 micron. Increased thermal conductivity can be obtained at the higher end of the exemplary range.

As depicted in FIG. 4B, a barrier layer 450 can be formed on the front side 412 and back side 414 of the handle wafer 410, thus forming a barrier layer 450 over each of the diamond layer 440 and the oxide layer 477. The barrier layer 450 can include a nitride deposited or otherwise formed to a thickness having suitable ion blocking effectiveness. For example, the nitride layer 450 can be deposited in a LPCVD to a thickness of about 1200 Å. The nitride layer 450 can be one of $Si_3N_4$, $Si_xN$, AlN, TaN, TiN, and silicon oxy-nitride. Certain metallic barriers can include TiW and TiWN as potential "metallic" barriers.

As depicted in FIG. 4C, a polysilicon 420 can be deposited over the nitride layer 450. The polysilicon 420 can be deposited to a thickness of about 10,000 Å to about 20,000 Å (2 um) over both the front side 412 and back side 414 of the handle wafer 410. The polysilicon 420 can be planarized on the front side 412 of the handle wafer 410. The planarization can be by CMP, and can include a touch polish to render the polysilicon 420 a thickness of about 5,000 Å to about 10,000 Å on the front side 412 of the handle wafer 410. A bond clean can be performed subsequent to the planarization. In certain embodiments, the polysilicon can be undoped, unless it is desirable to have a doped layer to form a "low resistance buried layer," which may be beneficial for some approaches like NPN bipolar flows.

The device wafer 470 is depicted in FIG. 4D and includes a thermal oxide layer 475 formed over the device wafer 470. The thermal oxide layer 475 can be grown to a thickness of about 650 Å.

As depicted in FIG. 4E, the handle wafer 410 can be bonded to the device wafer 470 to configure a bonded structure 400. Bonding can occur by annealing the mated handle wafer 410 and device wafer 470. The anneal can generate a thermal oxidation 490 on outer surfaces of the bonded structure 400. The thermal oxide 490 can be grown to a thickness of about 2 µm.

As depicted in FIG. 4F, that surface of the device wafer 470 not bonded to the handle wafer 410 can be ground and/or polished until the device wafer 470 is at a thickness of about 3 to about 7 µm. In order to render the device silicon thickness, polishing can remove about 2 um of the thermal oxide 490 and wafer device 470 silicon.

FIGS. 5A through 5E depict certain stages of processing a handle wafer 510 and a device wafer 570, without a nitride barrier layer in accordance with exemplary embodiments herein. It should be readily apparent to one of ordinary skill in the art that the device and method depicted in FIGS. 5A through 5E represents a generalized schematic illustration and that other steps and components can be added or existing steps and components can be removed or modified.

The handle wafer 510 can include an oxide material. The handle wafer 510 can include an oxide material or layers, on part or all of its surfaces. The handle wafer 510 can be formed in a process including, for example, steps of spin/rinse/dry (SRD), BW Backtouch, potassium hydroxide (KOH) clean, Scribe, Post Backtouch clean, and bond clean.

The device wafer 570 (FIG. 5C) can include a substrate, wafer or epitaxial layer, silicon or other semiconductor layer. In general, the semiconductor layer can include at least one of silicon, SiGe, SiC, GaN, InP, GaAs, AlGaN, InAlN, AlGaN, or combinations thereof. It will be appreciated that the handle or device wafers can be either N- or P-type, with low or high doping concentration, depending upon the application. The device wafer 570 can further include a thermal oxide layer 575 formed over the device wafer 570. The thermal oxide layer 575 can be deposited to a thickness of about 625 Å.

Figure 5A:
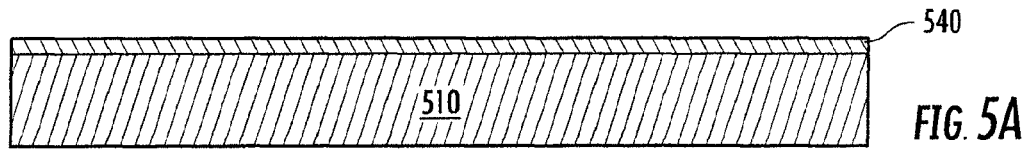
FIGS. 5A through 5E depict a further exemplary semiconductor device and corresponding method for forming, in accordance with embodiments of the present teachings.

As depicted in FIG. 5A, a diamond layer 540 can be deposited on the handle wafer 510. The diamond layer 540 can be formed by first chemically depositing a diamond seed layer by immersion in a colloid solution containing nanoparticles of diamond dust (not shown), from which the diamond layer 540 can be grown to a thickness of at least about 1.5 µm.

Figure 5B:
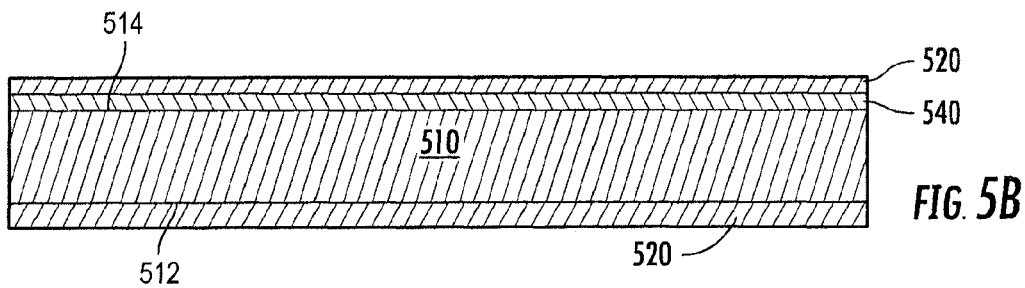
Figure 5C:
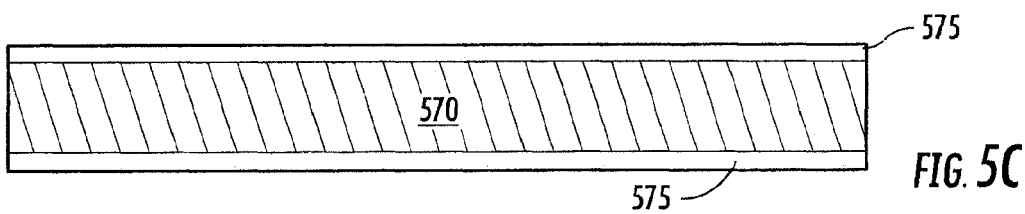

As depicted in FIG. 5B, a polysilicon 520 can be deposited to about 10,000 Å to about 20,000 Å (2 µm) over both a front side 512 and a back side 514 of the handle wafer 510. It will be appreciated that the terms front side and back side are used for purposes of description and are not intended to be limiting of an orientation of the handle wafer 510. The polysilicon 520 deposited on the handle wafer 510 can be planarized to a thickness of about 5,000 Å to about 10,000 Å by a chemical mechanical polishing (CMP) process, after which bond clean can be performed.

Figure 5D:
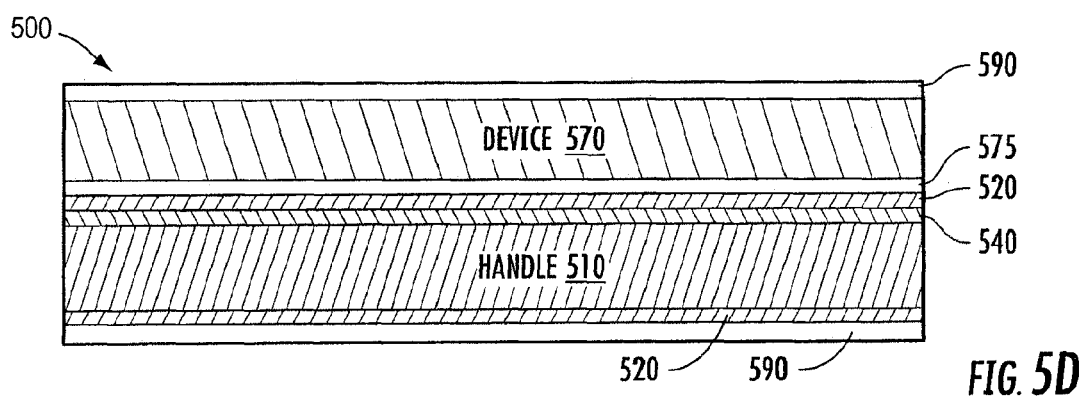

As depicted in FIG. 5D, the handle wafer 510 can be bonded to the device wafer 570 to configure a bonded semiconductor device structure 500. Bonding can occur by annealing the mated handle wafer 510 and device wafer 570. The anneal can generate a thermal oxidation on outer surfaces of the bonded structure 500. The thermal oxidation can grow a thermal oxide 590 to a thickness of about 2 µm.

Figure 5E:
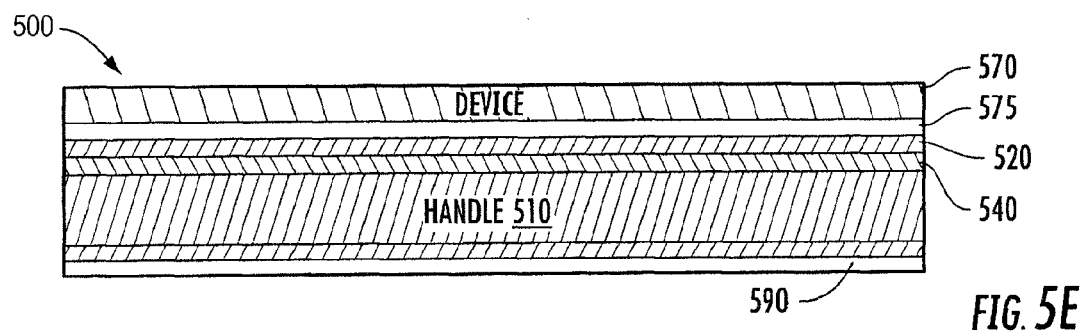

As depicted in FIG. 5E, that surface of the device wafer 570 not bonded to the handle wafer 510 can be ground and polished until the device wafer 570 has a thickness of about 3 to about 7 µm. In order to render the device silicon thickness, polishing can remove about 2 µm of thermal oxide 590 and wafer device 570 silicon.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g., −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion herein and appended claims, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method of forming a semiconductor device, comprising:
   on a device wafer, depositing a thin nitride layer on an active side of the device wafer between a diamond layer and the device wafer, wherein the thin nitride layer comprises a thickness of about 500 Å to about 3000 Å;
   depositing a polysilicon layer on the active side of the device wafer and on an oxide layer on a back side of the device wafer;
   planarizing the polysilicon on the active side of the device wafer; and
   attaching the planarized side of the device wafer to a handle wafer to form the semiconductor device.

2. The method of claim 1, wherein the thin nitride layer is deposited to a thickness of about 1000 Å.

3. The method of claim 1, further comprising:
   depositing polysilicon on the handle wafer side of the semiconductor device; and
   polishing a device side of the semiconductor device.

4. The method of claim 3, wherein polishing comprises polishing the device side of the semiconductor device to within about 0.1 to about 100 μm of a diamond-silicon interface of the device wafer.

5. A method of forming a semiconductor device, comprising:
   growing a pad oxide on front and back sides of a device wafer;
   depositing a thin (first) nitride layer over the front and back side pad oxide layers;
   growing a diamond layer on the front side thin nitride layer;
   depositing a second nitride layer on the diamond layer and the back side first nitride layer;
   etching the back side to substantially remove the first and second nitride layers;
   growing a thermal oxide on the etched back side of the device wafer;
   depositing a polysilicon layer on the front side of the device wafer and on the thermal oxide on the etched back side of the device wafer;
   planarizing the polysilicon on the front side of the device wafer; and
   attaching the planarized side of the device wafer to a handle wafer to form the semiconductor device.

6. The method of claim 5, wherein growing the pad oxide comprises growing to a thickness of about 650 Å.

7. The method of claim 5, wherein depositing the first nitride layer comprises depositing to a thickness of about 500 Å to about 3000 Å.

8. The method of claim 7, wherein depositing the first nitride layer comprises depositing to a thickness of about 1200 Å.

9. The method of claim 5, wherein growing the diamond layer comprises growing to a thickness of about 1.5 μm.

10. The method of claim 5, wherein depositing the second nitride layer comprises depositing to a thickness of about 500 Å to about 3000 Å.

11. The method of claim 10, wherein depositing the second nitride layer comprises depositing to a thickness of about 1200 Å.

12. The method of claim 5, wherein growing a thermal oxide comprises growing to a thickness of about 2 μm.

* * * * *